METHOD OF MAKING PACKAGES

Filed Sept. 8, 1969 2 Sheets-Sheet 1

INVENTOR.
MERYL E. MILLER
BY Fulwider, Patton, Rieber
Lee, and Utecht
ATTORNEYS

Jan. 23, 1973 M. E. MILLER 3,712,840

METHOD OF MAKING PACKAGES

Filed Sept. 8, 1969 2 Sheets-Sheet 2

INVENTOR.
MERYL E. MILLER
BY Zulwider, Patton, Rieber Lee, and Utecht
ATTORNEYS

United States Patent Office 3,712,840
Patented Jan. 23, 1973

3,712,840

METHOD OF MAKING PACKAGES

Meryl E. Miller, Palos Verdes Peninsula, Calif., assignor to Datanetics Corporation, Redondo Beach, Calif.

Filed Sept. 8, 1969, Ser. No. 855,827
Int. Cl. A41h 37/00
U.S. Cl. 156—66 18 Claims

ABSTRACT OF THE DISCLOSURE

A package including at least one hole extending through the entire package and hermetically isolated from the package contents, the package being formed by stacking a plurality of subassemblies between two face sheets of impervious material and aligning the contents by at least one vertical pin through which the hole passes. The package is bonded subsequent to stacking and is clamped together during bonding by a pair of pressure plates, the plates being removed upon completion of bonding to allow the final package to be positioned and aligned in an external apparatus.

BACKGROUND OF THE INVENTION

(1) Field of the invention

The present invention relates generally to improvements in sealed packages and methods of making such packages. More particularly, the invention relates to a method wherein electrical assemblies and the like may be aligned during their packaging in an elastomeric bladder so as to form a substantially sealed package with the components remaining permanently aligned therein.

(2) Description of the prior art

Many situations arise wherein it is necessary to house or encase an apparatus assembly within a substantially fluid impervious package to prevent fluid exchange between the apparatus and the external environment. Further, there are many situations wherein the contents of the package must be aligned within the package and also be capable of being precisely aligned with some apparatus external to the package.

One example of such a situation is that set forth in copending patent application, Ser. No. 823,785, entitled "Electrical Package," filed May 12, 1969, of which I am co-inventor.

As discussed in the latter application, it is often desirable to package electrical components and the like within an impervious bladder to prevent the contents from being affected by external environmental conditions. For example, it may be necessary to form a package such that it will not be affected by changes in external pressure as, for example, those encountered in relatively high altitude operations. It may also be desirable to prevent fluid exchange between the external environment and the electronics within the package so as to prevent contamination of the electronics.

The aforementioned application relates to a novel electrical package assembly wherein electrical components such as electrical switching elements, are packaged within an elastomeric bladder which is capable of expanding upon being subjected to low external pressures. The novel package prevents undesirable fluid exchange between the electrical contents thereof and the environment and also simultaneously prevents inadvertent actuation of the contents due to environmental pressure changes.

In forming a package of the beforementioned type, it is often desirable to incorporate means integral with the package for securing the package to some additional electrical or mechanical apparatus. For example, it may be desirable to precisely position the package in relation to an external actuator which functions through the package cover to operate the electrical components contained therein. In order to provide for alignment of the external device with the electrical apparatus carried within the package, it may be necessary to provide holes extending through the package so that the external device may cooperate therewith to be precisely aligned with the internal components of the package. In conjunction with providing such holes through the package, it may also be necessary to insure that the holes are formed in such a manner as to prevent leakage to the interior of the bladder, and simultaneously not detract from the expandability feature of the entire package.

For example, a package like that set forth in the aforementioned application may be used with an external keyboard apparatus which must be precisely positioned in relation to the package so that the key assembly actuators are appropriately aligned with the internal electronics of the package. One of the most effective ways to achieve the required precise alignment is to use alignment holes extending through the package and electronics carried therein, which cooperate with alignment pins or the like carried by the external keyboard apparatus. Such alignment pins may be positioned through the alignment holes to perform the function of not only initially aligning the external apparatus with the package, but also positively insuring that the precise alignment be retained throughout operation.

It will be apparent, therefore, that there is a need in the packaging arts for a relatively simple, relatively low cost, yet highly reliable method of forming a package which will minimize the effect of external environmental changes on the contents of the package while simultaneously maintaining precise alignment of the apparatus assembly within the package and enabling an external device to be precisely aligned with the contents thereof. The present invention clearly satisfies this need.

SUMMARY OF THE INVENTION

Briefly, and in general terms, the present invention provides a new and improved method for forming a substantially sealed package which provides a means for maintaining the contents of the package in precise alignment during package formation and simultaneously insures that the contents of the package will not become misaligned after assembly. Further, the new and improved package formed by the method of the present invention provides an alignment aperture through the package with which external apparatus may associate to be precisely aligned with contents thereof, the aperture being formed so as not to detract from the flexibility and sealed nature of the total package.

In a presently preferred embodiment of the subject invention, as discussed herein by way of illustration and not necessarily by way of limitation, the present invention provides a method of sealing a plurality of stacked electrical subassemblies or components, such as plated substrates, in precise vertical alignment within a substantially fluid-impervious bladder which is sealed about its outer edges to encapsulate at least a portion of the electrical apparatus.

According to the presently preferred embodiment of the method of this invention, the electrical apparatus is stacked and aligned between two sheets of impervious material, the alignment being accomplished by providing at least one alignment pin extending through the stacked electrical apparatus. Subsequent to stacking and aligning, the sheets are bonded about their peripheral edge so as to form a hermetically sealed package, the alignment pins being bonded to at least one of the face sheets during assembly so as to form an integral part of the final package.

The bladder is preferably fabricated from an elastomeric material and the alignment pin is preferably at least partly formed of elastomeric material. The alignment pin preferably extends completely through both the bladder face sheets and contents to provide for internal alignment of the components. The alignment pin has an axial hole through the center thereof to provide an aperture with which external apparatus may associate to be precisely aligned relative to the package contents.

The present invention provides a fast and efficient method of packaging and aligning an apparatus assembly within an impervious bladder which requires a minimum of assembly steps so as to be simple and low in cost, and which produces an improved package providing permanent alignment of the internal contents and integral means for precise alignment of the package with external apparatus.

The many features and advantages of the present invention will be pointed out in the following detailed description and claims, and illustrated in the accompanying drawings, which disclose, by way of example, the principles of the invention and the best mode which has been contemplated of applying these principles.

DESCRIPTION OF THE PREFERRED EMBODIMENT

Figure 1:
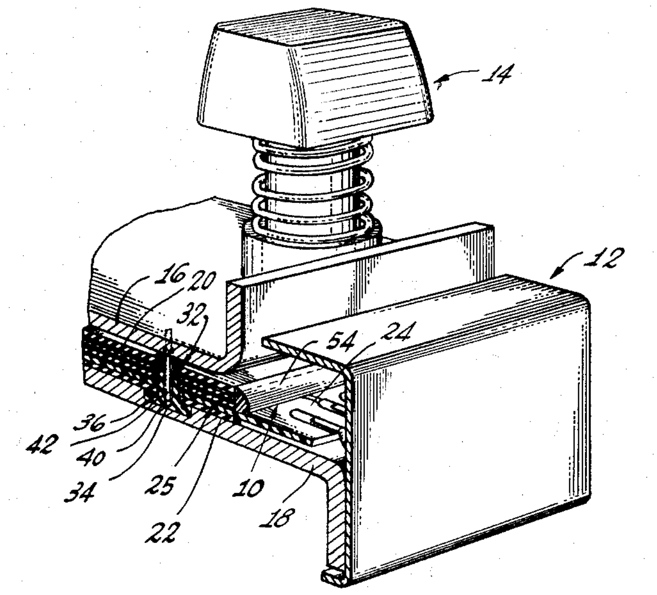
FIG. 1 is a perspective view, partly in cutaway section, disclosing the improved package formed by the method of the present invention as positioned and aligned in an external keyboard apparatus.

As shown in the drawings for the purposes of illustration, the present invention resides in an improved electrical package and method of forming the same wherein a plurality of stacked electrical components, such as plated substrates stacked to form pressure actuated switches, are hermetically sealed within a substantially impervious, resilient bladder. Although the invention is described in conjunction with the formation of a package particularly applicable for use with electronic keyboards and sealed switching devices, it is to be understood that it is not so limited, and may be also used for the packaging of other types of apparatus assemblies.

Referring primarily to FIG. 1, the electrical package 10 is shown in position in an electronic keyboard apparatus 12 having a key assembly 14 which is pressure actuated to cause electrical switching to occur with the package 10. The electrical package 10 is supported between a base plate 16 and a chassis plate 18 directly below the key assembly 14.

Figure 2:
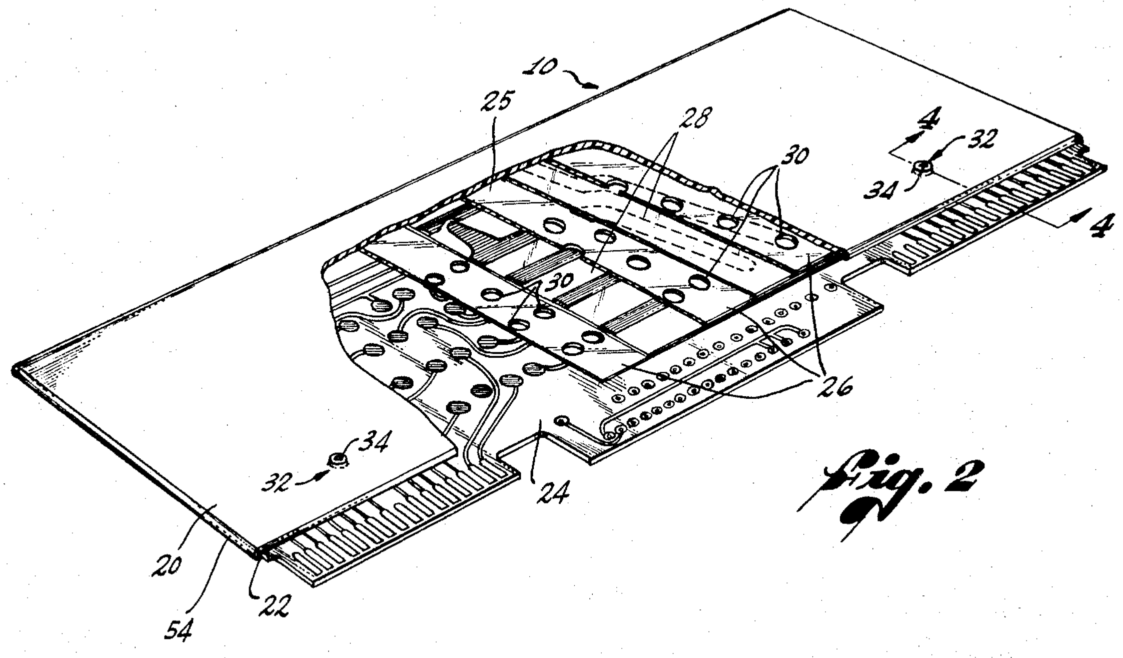
FIG. 2 is a perspective view, partly in cutaway section of the improved package formed by the method of the present invention.

As best seen in FIG. 2, the electrical package 10 employs a pair of flexible, impervious sheets 20 and 22, preferably formed of elastomeric material, which are sealed about their outer peripheries so as to form a substantially closed bladder. Within the upper and lower cover sheets 20 and 22, respectively, the multi-layer circuitry of the electrical package typically includes an etched circuit board 24 and a sandwich sub-assembly structure 25 including a plurality of insulating sheets 26 and thin substrates 28 upon which conductive electrical circuit patterns have been appropriately deposited.

The insulating sheets 26 are typically of thin polyester film such as Mylar, manufactured by E. I. du Pont de Nemours Company, Inc., and the substrates 28 may likewise consist of a thin film base of Mylar or the like, upon which electrical circuitry has been plated, etched or the like.

The insulating sheets 26 have aligned apertures 30 in selected locations so that pressure exerted by a selected key (FIG. 1) 14 will bring about electrical contact between various layers of circuitry deposited upon the substrates 28, and the circuitry of the circuit board 24 to effect the desired circuit switching.

In order to positively align and maintain the substrates in precise vertical alignment within the package assembly, a pair of vertical pins 32, preferably formed from, or coated with, an elastomeric material similar to that used to form the upper and lower cover sheets 20 and 22 of the bladder, extend vertically through the package 10. The pins 32 are bonded to the upper and lower elastomeric cover sheets 20 and 22, as will be presently discussed in more detail, and each pin 32 includes an axial hole 34 extending completely therethrough.

Figures 3, 4:
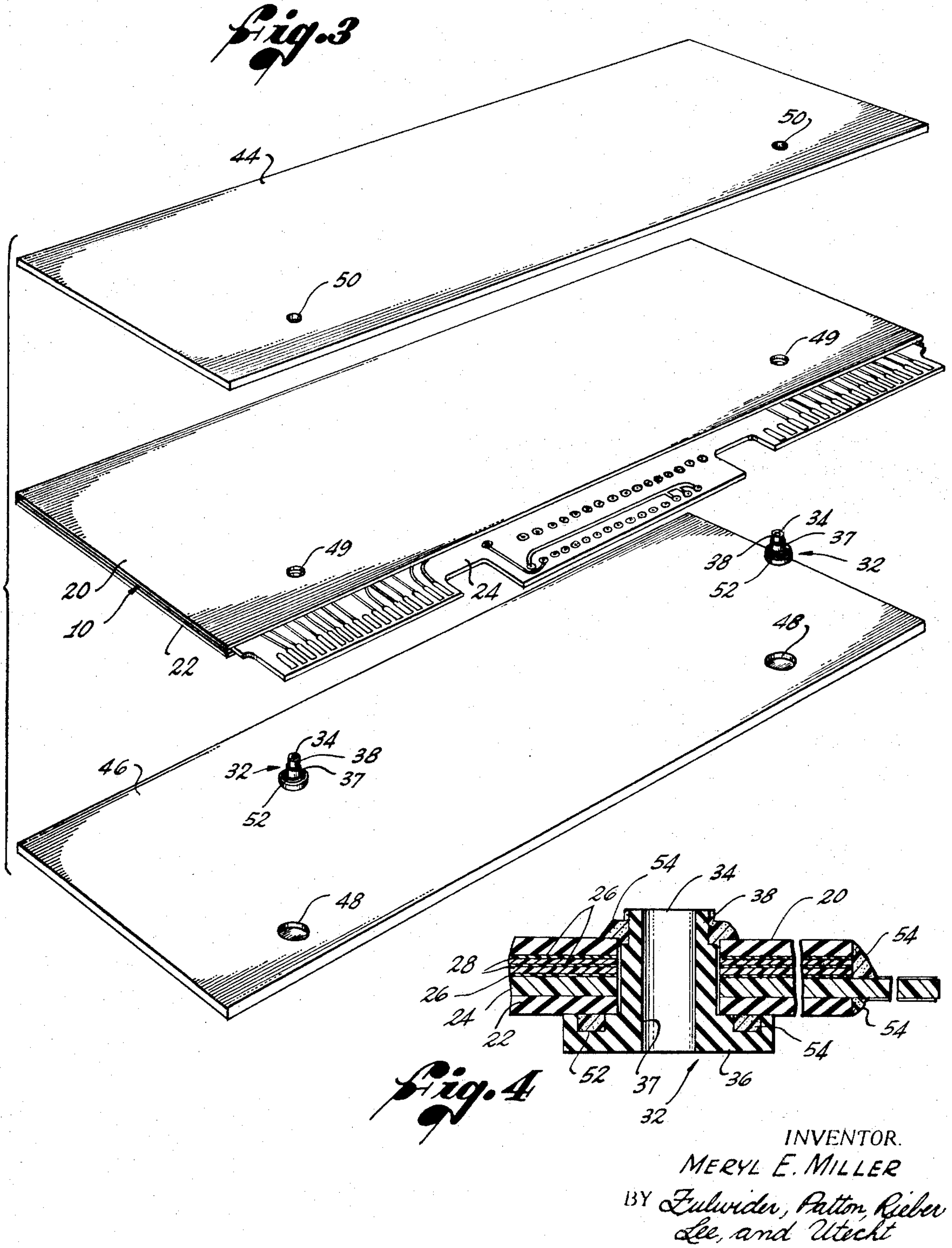
FIG. 3 is an exploded perspective view of the assembly steps utilized in forming the package of FIG. 2.
FIG. 4 is an enlarged sectional view of the final package taken along the lines 4—4 of FIG. 2.

As best seen in FIG. 3, the pins 32 extend completely through the package 10 and include an enlarged cylindrically headed end 36 adjacent the bottom of the package 10 and a small diameter end 38 extending above the top of the upper cover sheet 20.

Returning again to FIG. 1, the electronic keyboard apparatus 12 preferably includes a pair of cylindrical recessed portions 40 in the chassis plate 18, only one of which is shown, adapted to receive the head portions 36 of the alignment pins 32, such that the package 10 may be initially laid flat on the chassis plate 18 and aligned therewith by moving the package 10 until the heads 36 of the alignment pins 32 mate with the recesses 40.

Upon initially aligning the package 10 on the lower chassis plate 18, the base plate 16 is aligned with the package 10 by pins or pegs 42 which extend downwardly therefrom and extend through the holes 34 in the alignment pins 32, thus positively aligning the package 10 in precise position within the electronic keyboard 12.

As illustrated in FIG. 3, in order to form the package 10 of the subject invention, a pair of pressure plates 44 and 46 are provided for holding the components of the electrical package 10 during assembly. The pressure plates 44 and 46 are preferably formed from a substantially rigid material, such as metal, and prior to use may be coated with a light film of mold release compound of any suitable type, so as to prevent any excess sealant from becoming secured thereto.

The bottom pressure plate 46 includes a pair of spaced apertures 48 formed in the upper surface thereof, each of which has a diameter substantially equal to that of the diameter of the enlarged head 36 of an alignment pin 32, and a depth slightly less than that of the thickness of an alignment pin head 36.

The upper pressure plate 44 includes a pair of spaced apertures 50 which are adapted to be vertically aligned with the apertures 48 carried in the bottom pressure plate 46 and each of which have a diameter substantially equal to the outer diameter of the upper end 38 of an alignment pin 32.

To assemble the package 10 of the present invention, the alignment pins 32 are positioned in the apertures 48 of the lower pressure plate 46 so as to extend vertically upward therefrom. The annular groove 52 in the pin head 36 is then filled with a bonding or sealing material 54. One sealing material which has been found to be highly reliable is a room temperature vulcanizing silicone rubber sealant material known as RTV. The lower bladder face sheet 22 is then positioned over the alignment pins 32 and pressed into engagement with the lower pressure plate 46. The bladder face sheets 20 and 22 are dimensioned so as to extend beyond the lower and side edges of the stacked electrical assemblies so that the two edges may be sealed together to form an impervious boundary therearound. The upper edges of the bladder face sheets 20 and 22 preferably extend beyond the corresponding upper edges of the stacked sandwich sub-assembly 25 but below the upper edge of the etched circuit board 24, the latter extending beyond the bladder to provide the necessary electrical contacts for external connections. The bladder face sheets 20 and 22, etched circuit board 24 and sandwich sub-assembly 25 each have a pair of apertures 49 therethrough which are adapted to receive the shanks 37 of the alignment pins 32, the apertures 49 being positioned such that upon stacking, the composite package 10 will be in precise vertical alignment.

The electronic apparatus, including the circuit board 24 and sandwich sub-assembly 25, is then stacked on the lower bladder face sheet 22 and aligned by the alignment pins 32. The upper bladder face sheet 20 is then applied and an additional bead of sealing material 54, preferably RTV silicone rubber sealant, is then applied around the top of the alignment pin 32 and along the top of each bladder face sheet 20 and 22. The top pressure plate 44 is then positioned over the composite stack and aligned with the alignment pins 32. Suitable pressure may then be applied to the two pressure plates as, for example, by applying C-clamps to each of the four corners, to clamp the package together while the sealant cures. Before removal of the pressure plates 44 and 46, the side and bottom edges of the upper and lower bladder sheets 20 and 22 are sealed with a continuous bead of RTV silicone rubber 54 to provide a hermetically sealed package 10.

In the presently preferred form of the invention, the edges of the bladder 20 and 22 are sealed to each other simply by applying the sealing material 54 between the edges in an amount sufficient to completely fill the gap therebetween. However, it is readily apparent that other means may be used for sealing these edges. For example, the pressure plates 44 and 46 may include inwardly directed flanges along their sides and bottom (not shown) for pinching the bladder edges together so that less sealing material is required. Another example is to perform the bladder edge sealing step after removal of the pressure plates by using independent clamp means to pinch the edges together.

After completion of the required bonding or curing time, the pressure plates 44 and 46 can be removed from the package 10. The alignment pins 32, having been bonded to the bladder face sheets 20 and 22, are retained in position through the package 10 and, by virtue of the seal between the alignment pins 32 and the bladder face sheets 20 and 22, the alignment pins 32 are hermetically sealed thereto. Thus, the alignment pins 32 not only maintain the package components vertically aligned, but also provide holes 34 extending through the package 10, from one side to the other, the holes 34 being hermetically isolated so as not to allow the external environment to deleteriously affect the package contents. By virtue of using alignment pins 32 formed from elastomeric material, the expansibility feature of the bladder is unefected, the alignment pins 32 being sufficiently resilient to withstand small distortions.

The assembled package may then be positioned in the external keyboard apparatus 12 and precisely aligned therewith by the appropriate pins 42 which extend downwardly through the holes 34 in the alignment pins 32. Thus, the present invention provides a simple and efficient method for assembling a plurality of stacked components within a hermetically sealed package such that proper registration between successive layers of component parts is maintained at all times. Further, the present method provides a means by which the assembly may be totally sealed while simultaneously providing holes through the entire package, the holes being adapted for providing a means by which an external assembly may be precisely and positively positioned in relation to the contents of the package.

Although the present method and package have been described herein as embodying two alignment pins, it will be appreciated that this is by way of example only, and any number of alignment tooling pins may be used.

While the foregoing discussion has been directed to a presently preferred embodiment of the invention, it will be apparent that various modifications and variations therein may be effected without departing from the spirit and scope of the invention.

I claim:

1. A method of packaging apparatus in aligned relationship within a substantially impervious bladder, comprising the steps of:
- positioning said apparatus between two face sheets of substantially impervious material;
- vertically aligning said apparatus and said face sheets by positioning at least one substantially vertical pin therethrough;
- bonding said pin to one of said face sheets; and
- bonding said face sheets to each other about a portion of their peripheries, and bonding any remaining unbonded peripheral portions of the face sheets to the apparatus;
- whereby said face sheets form a substantially impervious bladder encasing at least a portion of said apparatus and said pin is bonded to said face sheet to maintain said apparatus in aligned relationship.

2. A method of packaging as set forth in claim 1, wherein said impervious material is an elastomeric material and said pin is formed from a similar elastomeric material.

3. A method of packaging as set forth in claim 1 and further including the step of:
- applying a bonding adhesive to a portion of said pin prior to said bonding of said pin to said one face sheet.

4. A method of packaging as set forth in claim 1, wherein said vertical pin has an axial hole extending therethrough, whereby additional means external to said package may be aligned with the contents of said package.

5. A method of packaging a plurality of electrical apparatus in stacked and aligned relationship within an impervious bladder, including:
- providing a lower face sheet of impervious material having at least one pin extending vertically upward therefrom;
- providing at least one alignment hole through each of said electrical apparatus;
- sequentially stacking said electrical apparatus on said lower face sheet such that said vertical pin extends through said holes to thereby vertically align said electrical apparatus;
- positioning an upper face sheet of impervious material over said stacked electrical apparatus; and
- bonding said face sheets to said pin and to each other about at least a portion of their peripheries whereby said face sheets form an impervious bladder encasing at least a portion of said electrical apparatus, and said pin is bonded to said face sheets to maintain said stacked electrical apparatus in aligned relationship.

6. A method of packaging as set forth in claim 5 and further including:
- applying pressure to said face sheets during said bonding.

7. A method of packaging as set forth in claim 5, wherein said impervious material is an elastomeric material and said pin is formed of elastomeric material having an axial hole extending therethrough.

8. A method of packaging as set forth in claim 5 and further including:
- providing at least one hole in said lower face sheet; and
- positioning said pin through said hole so as to extend vertically from said lower face sheet prior to stacking said electrical apparatus.

9. A method of packaging as set forth in claim 8 and further including:

applying a bonding adhesive to the peripheral edge of at least one of said face sheets and to at least a portion of said pin prior to said bonding.

10. A method of packaging as set forth in claim 9, wherein said pin includes an enlarged head portion adjacent said lower face sheet, said bonding adhesive being applied to said pin adjacent said head portion.

11. A method of packaging as set forth in claim 8 wherein said upper face sheet has at least one hole therethrough adapted to receive said pin, said pin extending through said hole upon positioning said upper face sheet over said stacked electrical apparatus to thereby vertically align said upper face sheet with said lower face sheet.

12. A method of packaging as set forth in claim 8, and further including:

supporting said lower face sheet on a lower pressure plate during said sequential stacking and positioning an upper pressure plate over said upper face sheet prior to said bonding.

13. A method of packaging as set forth in claim 12, and further including:

applying pressure to said pressure plates during bonding;

and removing said pressure and said pressure plates after said bonding is substantially complete.

14. A method of packing as set forth in claim 13 including coating said pressure plates with a mold release compound prior to use.

15. A method of packaging a plurality of electrical apparatus in stacked and aligned relationship within an impervious bladder, including the steps of:

positioning at least one elastomeric pin on a lower pressure plate so as to extend vertically upward therefrom;

positioning a lower elastomeric face sheet having at least one alignment hole therethrough on said lower pressure plate such that said pin extends through said alignment hole;

sequentially stacking said electrical apparatus on said lower face sheet, each of said electrical apparatus having an alignment hole through which said pin extends to thereby vertically align said electrical apparatus upon stacking;

positioning an upper elastomeric face sheet having at least one alignment hole therethrough on said stacked electrical apparatus such that said pin extends through said alignment hole in said upper face sheet;

applying an upper pressure plate to the top of said upper face sheet;

bonding said face sheets to said pin and to each other about at least a portion of their peripheries; and removing said upper and lower pressure plates after said bonding, whereby said elastomeric face sheets form an impervious bladder encasing at least a portion of said electrical apparatus and said elastomeric pin is bonded to said face sheets to maintain said stacked electrical apparatus in aligned relationship.

16. A method of packaging as set forth in claim 15, and further including the steps of:

applying to said elastomeric pin a bonding adhesive prior to positioning said lower face sheet on said lower pressure plate and after positioning said upper face on said stacked electrical apparatus; and applying to the peripheral edge of at least one of said face sheets a bonding adhesive prior to said bonding.

17. A method of packaging as set forth in claim 16 and further including the step of:

applying external pressure to said pressure plates during said bonding.

18. A method of packaging as in claim 16 and further including the step of:

applying a mold release compound to said pressure plates prior to use.

References Cited

UNITED STATES PATENTS

| | | | |
|---|---|---|---|
| 3,504,357 | 7/1970 | Reid | 174—68.5 |
| 3,566,005 | 2/1971 | Shaheen | 174—68.5 |
| 3,114,807 | 12/1963 | Koda | 174—68.5 |
| 3,177,315 | 4/1965 | Clare | 317—101 CP |

BENJAMIN A. BORCHELT, Primary Examiner

H. J. TUDOR, Assistant Examiner

U.S. Cl. X.R.

53—26; 156—91